United States Patent
Shamlou et al.

(10) Patent No.: US 6,452,424 B1
(45) Date of Patent: Sep. 17, 2002

(54) METHOD AND APPARATUS FOR MULTIPLE CHANNEL SIGNAL PROCESSING

(75) Inventors: Daryush Shamlou, Laguna Niguel; Guang-Ming Yin, Foothill Ranch; Yihai Xiang, Irvine; Wim Cops, Newport Beach; Bo Zhang, Las Flores, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/406,954

(22) Filed: Sep. 28, 1999

(51) Int. Cl.[7] .............................. H03K 5/22; H03K 5/00
(52) U.S. Cl. .............................. 327/91; 327/554; 330/9
(58) Field of Search ............................ 327/554, 90, 91, 327/94, 337; 330/9; 333/172, 171

(56) References Cited

U.S. PATENT DOCUMENTS

| 4,438,354 A | 3/1984 | Haque et al. ............... 327/337 |
| 4,446,438 A | * 5/1984 | Chang et al. ............... 327/554 |
| 4,538,113 A | 8/1985 | Lish ............................ 330/126 |
| 4,562,404 A | 12/1985 | Futakuchi ................... 329/118 |
| 4,616,185 A | 10/1986 | van Roermund ............ 327/356 |
| 4,616,192 A | 10/1986 | van Roermund ............ 331/14 |
| 4,716,375 A | 12/1987 | van Roermund ............ 327/356 |
| 5,331,222 A | 7/1994 | Lin et al. .................... 327/553 |
| 5,533,023 A | 7/1996 | Ohlson et al. ............... 370/319 |
| 5,754,597 A | 5/1998 | Lurey et al. ................. 375/295 |
| 5,864,561 A | 1/1999 | Becher ........................ 327/407 |
| 6,037,887 A | * 3/2000 | Wu et al. .................... 341/143 |

FOREIGN PATENT DOCUMENTS

| EP | 0 774 850 A2 | 5/1997 |
| EP | 0 774 850 A3 | 9/1998 |
| JP | 363153907 | * 6/1988 |
| JP | 09121123 | 5/1997 |

* cited by examiner

Primary Examiner—Dinh T. Le
(74) Attorney, Agent, or Firm—Farjami & Farjami LLP

(57) ABSTRACT

A multiple channel signal processing circuit receives an input associated with a first channel and an input associated with a second channel. The respective inputs are sampled and processed by the circuit, which generates a sampled output signal for the first channel and a sampled output signal for the second channel. The circuit employs a shared active circuit component, such as an operational amplifier, to alternately process samples associated with the first and second channels. A network of switches are controlled by a multiphase clock signal such that the active circuit component processes samples associated with only one channel at a time; as the input for a first channel is being sampled, a previous sample for the second channel is processed. An alternate circuit embodiment may be utilized to reduce the amount of crosstalk between the channels.

14 Claims, 2 Drawing Sheets

METHOD AND APPARATUS FOR MULTIPLE CHANNEL SIGNAL PROCESSING

FIELD OF THE INVENTION

The present invention relates generally to active analog signal processing circuits. More particularly, the present invention relates to an active analog signal processing circuit that processes signals associated with multiple channels.

BACKGROUND OF THE INVENTION

Multiple channel signal processing circuits are common in such applications as cellular telephone systems, stereo audio systems, and home theater systems. For example, the analog front end portion of a cellular telephone system may utilize well known quadrature modulation techniques to process in-phase and quadrature-phase baseband signals associated with different channels (I/Q signals). Conventional multiple channel systems have employed duplicate analog circuits for each signal channel. Such analog circuits typically include a plurality of active circuit components and any number of passive electronic components.

FIG. 1 is a general block diagram representation of a prior art multiple channel processing circuit 100 configured to accommodate an in-phase ("I") input signal 102 and a quadrature ("Q") input signal 104. For purposes of this general introduction, the specific function of circuit 100 need not be described in detail; circuit 100 may be utilized in any number of applications such as a switched-capacitor filter, an analog to digital converter, a switched-capacitor digital to analog converter, or the like. In the present context, circuit 100 utilizes discrete time sampling of analog input signals. I-input signal 102 and Q-input signal 104 are each sampled in accordance with a given sampling rate and sampling period. An analog processing circuit 106 associated with the I-input signal 102 includes a number of active circuit components 108 and a number of passive circuit components 1 10. Similarly, an analog processing circuit 112 associated with the Q-input signal 104 includes a number of active circuit components 114 and a number of passive circuit components 116. Analog processing circuit 106 and analog processing circuit 112 may be substantially identical to one another. In this manner, prior art techniques simply duplicate the analog processing circuits N times to accommodate N signal processing channels.

Analog processing circuit 106 produces an I-output signal 118, while analog processing circuit 112 produces a Q-output signal 120. Output signals 118 and 120 are generated in a sampled manner in response to the particular characteristics of analog processing circuits 106 and 112. Output signals 118 and 120 may be further processed in accordance with any number of conventional techniques depending upon the specific application.

Although the prior art approach may simplify the design aspect of a multiple channel system, it has some practical limitations. For example, as the number of channels increase, the required prior art circuitry will proportionately increase, with a corresponding increase in power consumption and semiconductor die size. However, with the increasing demand for hardware miniaturization, the amount of power, physical size, and number of components associated with semiconductor implementations can place limitations on the design of the analog circuitry. Accordingly, due to practical size and power constraints, the simple duplication of active signal processing circuits may not be a desirable implementation for a multiple channel signal processing application.

SUMMARY OF THE INVENTION

A multiple channel signal processing solution in accordance with the present invention utilizes a shared active circuit component to process a plurality of input signals during a sampling period. Rather than merely duplicating an active processing circuit for each input channel, the exemplary system employs at least one common active electronic component in conjunction with similar passive component networks associated with each channel. The reduction of active circuit components results in a reduction of operating power and a reduction in the size of the semiconductor implementation. Thus, a practical embodiment may be realized in a compact manner and without a considerable increase in the power requirements.

The above and other features of the present invention may be carried out in one form by a multiple channel signal processing circuit having a first input associated with a first signal for a first channel, a second input associated with a second signal for a second channel, a network of passive electronic components configured to process samples of the first signal and samples of the second signal, a shared active electronic component configured to process samples of the first signal and samples of the second signal, and a channel switching mechanism configured to switch between processing states associated with the first channel and the second channel during a sampling period.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF A PREFERRED EMBODIMENT

The present invention may be described herein in terms of functional block components and various processing steps. It should be appreciated that such functional blocks may be realized by any number of hardware components configured to perform the specified functions. For example, the present invention may employ various integrated circuit components, e.g., transistor based switches, resistors, capacitors, operational amplifiers, and the like, which may carry out a variety of functions. In addition, those skilled in the art will appreciate that the present invention may be practiced in conjunction with any number of data communication contexts and that the system described herein is merely one exemplary application for the invention. Further, it should be noted that the present invention may employ any number of conventional techniques such as filtering, conditioning, sampling, clocking, and the like. Such general techniques that may be known to those skilled in the art are not described in detail herein.

It should be appreciated that the particular implementations shown and described herein are merely illustrative and are not intended to limit the scope of the present invention in any way. Indeed, for the sake of brevity, conventional signal processing, data transmission, and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical system.

Figure 1:
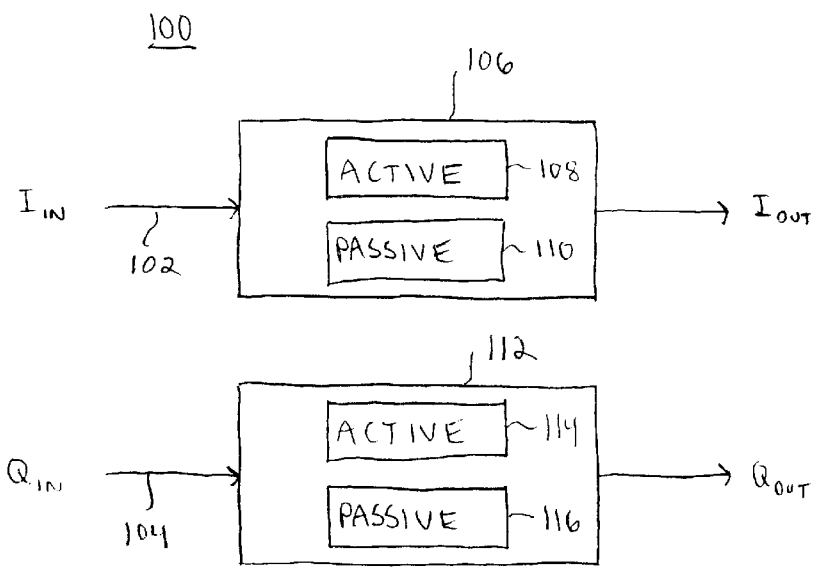
FIG. 1 is a block diagram representation of a prior art multiple channel signal processing environment.
Figure 2:
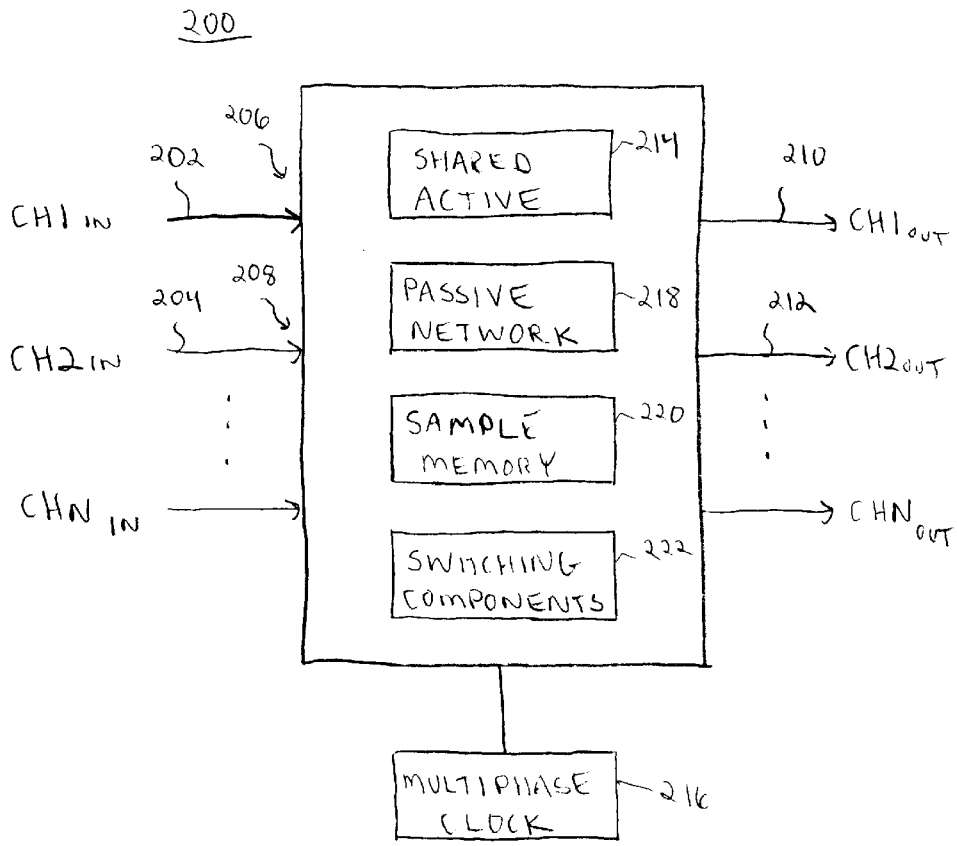
FIG. 2 is a block diagram representation of an exemplary multiple channel signal processing circuit.

FIG. 2 is a block diagram of a general multiple channel signal processing circuit 200 configured in accordance with an exemplary embodiment of the present invention. The specific function of circuit 200 may vary from application to application. For example, circuit 200 may be implemented in a multiple channel audio system, a cellular telephone system that processes I/Q signals, or the like. Furthermore, the concepts of the present invention may be implemented in any suitable circuit 200 that employs a discrete time sampling technique. In a practical embodiment, circuit 200 may be realized as a switched capacitor filter, an analog to digital converter, a digital to analog converter, an integrator, or the like.

Circuit 200 is configured to receive at least a first input signal 202 associated with a first channel and a second input signal 204 associated with a second channel. As shown in FIG. 2, circuit 200 may be suitably configured to receive any number of input signals associated with any number of corresponding channels. In the context of this description, a "channel" means any communication or processing path associated with an electrical signal. First signal 202 may be provided to circuit 200 via a first input 206, and second signal 204 may be provided to circuit 200 via a second input 208. First and second inputs 206 and 208 may be realized by a suitable electrical conductor; first and second inputs 206 and 208 need not be implemented as a distinct physical component. After processing by circuit 200, a first output signal 210 is produced for the first channel and a second output signal 212 is produced for the second channel.

In the exemplary embodiment described herein, first and second signals 202 and 204 are analog signals. The input signals are sampled at a specified sampling rate (which is dictated by the particular application); during a given clock period, each of the channels are suitably processed by circuit 200. As discussed above, prior art systems typically employ duplicate circuits to separately process each channel. In contrast, circuit 200 leverages multi-sampling techniques such that a shared active component 214 can process a plurality of channels during a single sampling period. In other words, rather than having an active circuit element devoted to each channel, circuit 200 uses shared active component 214 to process samples of at least two input signals. Circuit 200 is preferably configured such that shared active component 214 functions in conjunction with only one channel at a time.

Circuit 200 may include or be operatively associated with a multiphase clock 216. Multiphase clock 216 may be configured and/or generated in accordance with any number of known techniques. For example, a two-phase clock may be obtained from the primary sampling clock signal and from the inverse of the primary sampling clock signal. Similarly, an N-phase clock may be generated to support an N-channel circuit 200. Circuit 200 cooperates with multiphase clock 216 such that shared active component 214 processes a sample from first input signal 202 during one phase of multiphase clock 216, while processing a sample from second input signal 204 during a different phase of multiphase clock 216. In operation, circuit 200 may perform the task of deriving the multiphase clock from a primary sampling clock.

Circuit 200 may include a passive network 218 that operates in conjunction with shared active component 214. Passive network 218 may include any number of passive electronic components such as capacitors, resistors, inductors, or the like. In preferred embodiments, passive network 218 is realized in accordance with conventional semiconductor design techniques. However, passive network 218 may include discrete electronic components depending upon the practical application. Passive network 218 cooperates with shared active component 214 (and possibly other active or passive elements) to process samples of the incoming input signals in an appropriate manner.

Circuit 200 may also incorporate a sample memory element 220. Sample memory element 220 may be realized by any number of active or passive components, e.g., capacitors, inductors, or the like. In the exemplary analog embodiment described herein, sample memory element 220 may be implemented by a suitable switched capacitor network. Sample memory element 220 is configured to store or hold a processed sample associated with a first channel while a current sample associated with a second channel is being processed by shared active component 214. In this manner, shared active component 214 need not be burdened with the simultaneous processing of samples associated with different channel inputs. Rather, shared active component 214 is configured to alternately process samples of the first input signal 202 and samples of the second input signal 204.

As described above, circuit 200 may include a number of switching components 222 that enable circuit 200 to perform multiple channel signal processing. In conjunction with multiphase clock 216, switching components 222 may form a suitable channel switching mechanism that is configured to switch between processing states associated with the first channel and the second channel during a sampling period, e.g., during one primary sampling period. Switching components 222, may be configured to make first and second input signals 202 and 204 available for processing at the appropriate times, to facilitate the charging and discharging of capacitors associated with sample memory element 220, to select a particular channel for processing, or the like. As described above, switching components 222 may be configured in accordance with well known transistor-based semiconductor design techniques. Switching components 222 may include a plurality of individual switching elements that observe a specific switching pattern. The switching pattern and/or the actual actuation of switching components 222 may be controlled by a suitable control signal, e.g., switching components may be responsive to multiphase clock 216 or a microprocessor based control scheme.

Figure 3:
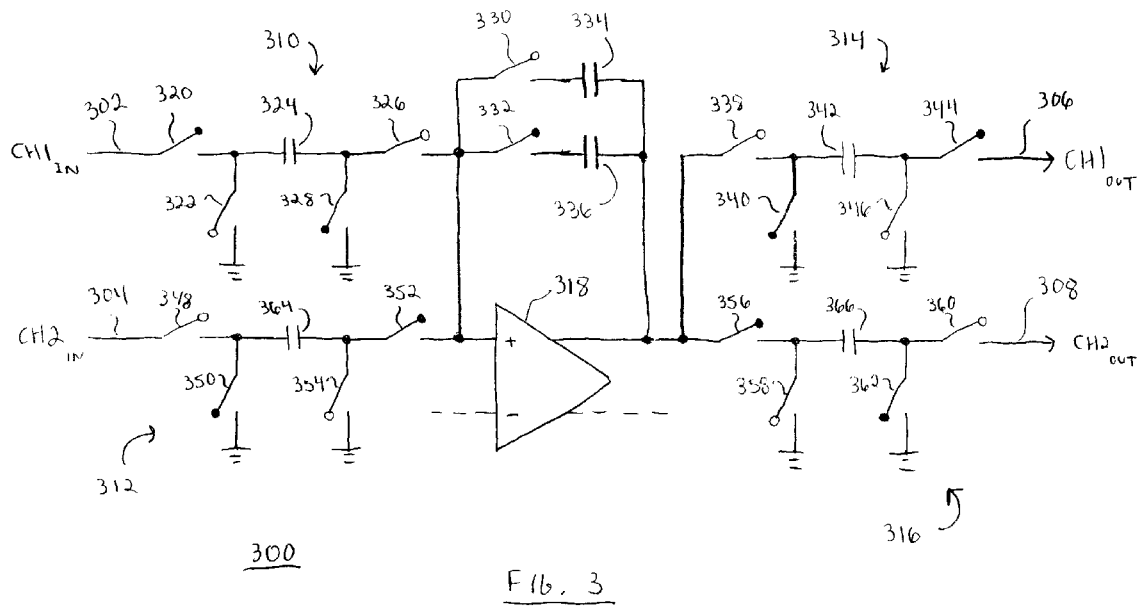
FIG. 3 is a schematic of an exemplary multiple channel signal processing circuit.

FIG. 3 is a schematic diagram of a multiple channel signal processing circuit 300 that is configured in accordance with the present invention. Circuit 300 obtains an analog input signal 302 associated with a first channel and an analog input signal 304 associated with a second channel. Circuit 300 is configured to generate a sampled analog output signal 306 associated with the first channel and a sampled analog output signal 308 associated with the second channel. Circuit 300 employs discrete time sampling techniques to sample the incoming analog signals at a certain sampling rate.

Circuit 300 includes a first input section 310 for handling input signal 302 and a second input section 312 for handling input signal 304. In a corresponding manner, circuit 300 includes a first output section 314 for handling output signal 306 and a second output section 316 for handling output signal 308. A shared active circuit component, e.g., an operational amplifier 318, is configured to support both channels by suitably processing samples associated with input signals 302 and 304. In the exemplary embodiment described herein, operational amplifier 318 is operatively coupled to first input section 310, first output section 314, second input section 312, and second output section 316. In a practical implementation, operational amplifier 318 may be a differential amplifier (for the sake of clarity and brevity, the circuitry associated with the negative input and output terminals is not shown). Although the negative input and output circuitry is typically identical to the positive input and output circuitry, circuit 300 may be configured in an "asymmetric" manner.

A plurality of switches may be controlled by a multiphase clock which is in turn related to the primary sampling clock. FIG. 3 depicts an example circuit that utilizes a two-phase clock in connection with the processing of two input signals for two channels. In FIG. 3, the switches having solid ends are closed during the first phase of the two-phase clock and open during the second phase of the two-phase clock. Conversely, the switches having circled ends are closed during the second phase of the two-phase clock and open during the first phase of the two-phase clock. The switches are preferably timed for substantially concurrent opening and closing of switches having different phases. However, a particular design may implement certain delays or overlaps in the timing of one or more switches. The switches enable portions of circuit 300, e.g., the input sections, the output sections, and/or the shared active component section, to be configured and reconfigured as necessary to perform the multiple channel signal processing described herein. Accordingly, for any given sampling period, circuit 300 alternatively samples first input 302 and second input 304. The associated signal processing also follows the alternating technique on a sample by sample basis. As discussed above, circuit 300 may be modified to support additional channels.

For the sake of brevity, circuit 300 is described herein in the context of a single channel. However, the description applies in an analogous manner to both channels of circuit 300. First input section 310 includes a switch 320 having an input side that receives input signal 302. A switch 322 is coupled between an output side of switch 320 and a circuit ground. A capacitor 324 is coupled between the output side of switch 320 and an input side of a switch 326. A switch 328 is coupled between the input side of switch 326 and a circuit ground. The output side of switch 326 is operatively associated with an input of operational amplifier 318. In the embodiment illustrated in FIG. 3, the output of switch 326 is directly coupled to the input of operational amplifier 318. However, in an alternate embodiment, the output of switch 326 may be indirectly coupled to the input of operational amplifier 318 via any number of additional switches, passive electronic components, or active electronic components.

In the embodiment shown in FIG. 3, the output node associated with switch 326 is also coupled to the input side of a switch 330 and to the input side of a switch 332. The output side of switch 330 is coupled to a capacitor 334, while the output side of switch 332 is coupled to a capacitor 336. In an alternate embodiment, switch 330, switch 332, capacitor 334, and capacitor 336 may be differently arranged. The output sides of capacitors 334 and 336 are coupled to an output of operational amplifier 318. Switch 330 and capacitor 334 are utilized in conjunction with the first channel, while switch 332 and capacitor 336 are utilized in conjunction with the second channel.

In FIG. 3, output section 314 is but one possible configuration for a circuit 300. Indeed, the concepts of the present invention may be utilized in a number of different circuits having various input and output configurations. For example, the multiple channel outputs may be directly taken from operational amplifier 318 and the different channel signals may be distinguished by a suitable clock synchronization technique associated with the two-phase clock signal. Alternatively, where circuit 300 is implemented in a larger overall circuit, the "output" signals 306 and 308 may serve as inputs to one or more additional circuit sections.

Output section 314, which is suitably configured to provide output samples associated with the multiple channels, includes a switch 338 having an input side operatively associated with an output of operational amplifier 318. A switch 340 is suitably coupled between an output side of switch 338 and a circuit ground. A capacitor 342 is coupled between the output side of switch 338 and the input side of another switch 344. A switch 346 is coupled between the input side of switch 344 and a circuit ground. An output side of switch 344 is associated with the output of circuit 300 for the first channel, i.e., output signal 306 is made available at the output side of switch 344.

The equivalent circuit components associated with channel two include switches 348, 350, 352, 332, 354, 356, 358, 360, and 362. In addition, the channel two circuitry may include capacitors 364, 336, and 366. In the context of circuit 300, several components (or features) may be considered to be shared between the first and second channel branches, e.g., operational amplifier 318 and the analog ground.

The particular capacitances of capacitors 324, 334, and 342 may be appropriately selected in accordance with the desired performance of circuit 300. For example, the capacitances may be selected in response to the desired integration gain, response time, and other operating characteristics of circuit 300. In an exemplary embodiment, the circuit components associated with the second channel are identical to the circuit components associated with the first channel. However, such symmetry is not a requirement of the present invention, and the individual components may be selected to suit the particular needs of the given application.

With continued reference to FIG. 3, the operation of circuit 300 will be described in the context of the processing of a multiple channel input signal. For purposes of the following description, input signals 302 and 304 are distinct analog signals. In a practical multiple channel system, input signals 302 and 304 may be cooperatively related to one another, e.g., the left and right channels of a stereo audio signal, or the I and Q portions of a quadrature modulated signal. As described above, circuit 300 preferably operates in conjunction with a two-phase clock signal that is derived from the primary sampling clock. Thus, for one primary sampling clock period, the two-phase clock is capable of taking two effective samples. The following description refers to the timing of the two-phase clock rather than the primary sampling clock. For illustrative purposes, all of the capacitors in circuit 300 are assumed to be fully discharged during time t0.

During time $t_1$, switches 320, 328, 350, 352, 332, 340, 344, 356, and 362 (the switches having solid tips in FIG. 3) close while switches 322, 326, 348, 354, 330, 338, 346, 358, and 360 (the switches having circled tips in FIG. 3) open. Consequently, input section 310 is configured to obtain a sample of input signal 302. With respect to input section 310 associated with channel one, input signal 302 is suitably sampled and capacitor 324 is charged during time $t_1$. Assuming that all other capacitors have been previously initialized, the remainder of circuit 300 remains "inactive" during time $t_1$.

During time $t_2$, all of the switches reverse their states, i.e., the solid-tipped switches open while the circle-tipped switches close. Accordingly, input section 312 is configured to obtain a sample of input signal 304, while the shared active component section is configured to process the previous sample associated with channel one. In the context of this description of circuit 300, time $t_1$ and time $t_2$ occur during one primary sampling period. During time $t_2$, input signal 304 associated with channel two is sampled and capacitor 364 is charged. However, input signal 302 for channel one is isolated by switch 320, and the closure of switches 322, 326, 330, 338, and 346 reconfigure circuit 300 such that operational amplifier 318 (in cooperation with capacitors 324, 334, and 342) suitably processes the current sample of input signal 302. In this respect, the current sample of input signal 302 is processed such that capacitors 334 and 342 are charged. During time $t_2$, the output section of channel two is isolated due to the opening of switch 356. No output signal 308 is generated at this time, assuming that capacitor 366 was initialized with no charge.

At time $t_3$, the switches again reverse states such that the solid-tipped switches are closed and the circle-tipped switches are open. Time $t_3$ is associated with a new primary sampling period; the next sample of input signal 302 is obtained for channel one. In this manner, input signal 302 (for channel one) and input signal 304 (for channel two) are alternately sampled at the primary sampling rate. The sampling of the two channels may be considered to be offset in time by one half of the primary sampling period.

During time $t_3$, the closure of switches 350, 352, 332, 356, and 362 enables circuit 300 to utilize operational amplifier 318 for the processing of the previous sample associated with channel two. In other words, the shared active component section is suitably reconfigured to process a sample associated with second input signal 304. Thus, capacitors 336 and 366 are suitably charged during time $t_3$. Accordingly, circuit 300 is preferably configured such that operational amplifier 318 actively processes samples for only one channel at a time. Such a configuration allows circuit 300 to function like two duplicate circuits without doubling the complexity, size, and power consumption of a single processing circuit.

With respect to output section 314 of channel one, switch 338 provides isolation during time $t_3$. However, the closure of switches 340 and 344 enable capacitor 342 to discharge, producing a sampled output. In this manner, output section 314 is appropriately reconfigured such that output signal 306 for channel one is generated in response to the sampled input signal 302. For the exemplary embodiment shown in FIG. 3, an output sample is generated one primary clock period after the corresponding input signal is sampled. The particular characteristics of output signal 306 will be dictated by the configuration of circuit 300 and the capacitance values for the various capacitors included in circuit 300.

During time $t_4$, switch 356 opens to provide isolation for the output section of channel two. Concurrently, the closure of switches 358 and 360 reconfigures output section 316 to enable capacitor 366 to discharge, thus producing the sampled output for channel two. The alternating generation of sampled outputs for the two channels continues in this manner.

As described above, the particular configuration of a circuit according to the present invention may vary from circuit 300. For example, an alternate configuration may eliminate capacitors 334 and 336 and employ a different switching arrangement such that capacitors 324 and 364 are alternately switched to equivalently perform respective functions of capacitors 334 and 336. Furthermore, switches 330 and 332 may be replaced or supplemented with any number of other switches configured in any suitable manner to further enhance the isolation between the channels. Such additional switches may be located near capacitors 334 and/or 336 to further reduce crosstalk caused by, e.g., residual charges. Indeed, those skilled in the art can apply any number of sampling and switching techniques in conjunction with the shared active component technique of the present invention.

Referring again to FIG. 2, passive network 218, shared active component 214, and switching components 222 (in conjunction with multiphase clock 216) are cooperatively configured to obtain a current sample of first input signal 202 during a first time period, to obtain a current sample of second input signal 204 during a second time period, and to process the current sample of first input signal 202 during the second time period. In addition, these elements of circuit 200 are also cooperatively configured to process the current sample of the second input signal during a third time period following the second time period. The switching mechanism facilitates the reconfiguring of the different portions of circuit 200 such that multiple channels may be processed by a single active electronic component 214.

Due to the alternating processing of the two channels, the sampled output signal 308 may be delayed relative to the sampled output signal 306. With respect to circuit 300 described herein, the delay between output signals 308 and 306 is one phase of the two-phase clock, i.e., one-half of the primary clock period. An alternate embodiment configured to process three channels in an analogous manner may have a minimum delay of one-third of the primary clock period between two channels. Consequently, circuit 300 may include or be operatively associated with a number of components or elements configured to compensate for such delays. For example, one or more delay elements may be utilized to introduce a suitable amount of delay to the sampled outputs. Such delay elements may be configured in accordance with conventional or proprietary techniques such that the respective output samples are substantially aligned relative to the primary sampling clock or relative to any suitable time reference.

The exemplary circuit 300 described above may be suitable for many practical applications, such as a wireless application that employs I/Q baseband signal processing. Such an application may require only about 40 dB of crosstalk isolation between channels. Thus, the amount of crosstalk introduced by parasitic capacitances associated with the active circuit component, the switches, and/or the wiring can be easily reduced to a tolerable level in certain applications. On the other hand, for other applications that require a higher amount of channel isolation, e.g., high performance audio applications, additional precautions may need to be taken to enable circuit 300 to meet more stringent crosstalk specifications. For example, circuit 300 may use a high gain operational amplifier in an effort to reduce crosstalk.

Undesirable crosstalk may be attributed to different sources in circuit 300. For example, the finite gain of operational amplifier 318 may be one source of crosstalk. In addition, crosstalk may be caused by unwanted parasitic capacitance associated with switches 326, 352, 330, and 332 (and the wiring associated therewith). The amount of crosstalk is proportional to the amount of stray capacitance and inversely proportional to the finite gain of operational amplifier 318.

Figure 4:
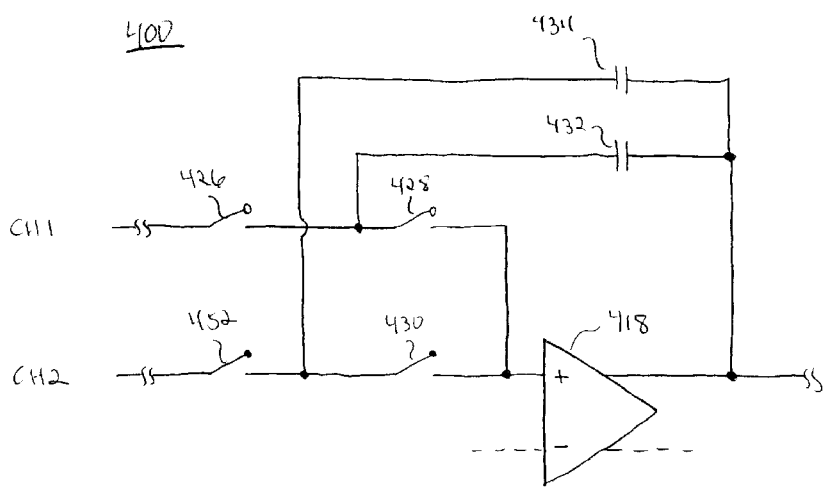
FIG. 4 is a schematic of a portion of a multiple channel signal processing circuit configured in accordance with an alternate embodiment of the present invention.

Referring now to FIG. 4, a portion of a multiple channel signal processing circuit 400 configured in accordance with an alternate embodiment of the present invention will be described. Circuit 400 may be employed in an environment substantially similar to circuit 300. Indeed, for the sake of brevity and clarity, portions of circuit 400 that are analogous to portions of circuit 300 are not shown or described in connection with FIG. 4.

Circuit 400 includes a switch 426 associated with channel one and a switch 452 associated with channel two. Switch 426 and switch 452 are respectively equivalent to switch 326 and switch 352 shown in FIG. 3. Unlike circuit 300, the output sides of switches 426 and 452 are not coupled directly to the input of an operational amplifier 418. Rather, the output side of switch 426 is coupled to the input side of a switch 428, while the output side of switch 452 is coupled to the input side of a switch 430. The output side of switch 428, along with the output side of switch 430, is coupled to an input to operational amplifier 418. In contrast to the equivalent portion of circuit 300 (where four switch terminals are coupled to operational amplifier 318), only two switch terminals are coupled to operational amplifier 418. In addition, switches 428 and 430 may be relatively smaller in physical size because they are not located in a major signal path. Unlike switch 330, when switch 428 is open, no residual signal from the other channel will go to the input side of switch 428 (the same holds true for switch 430).

Regarding channel one, the output side of switch 426 (which is also the input side of switch 428) is connected to a capacitor 432. For channel two, the output side of switch 452 (which is also the input side of switch 430) is connected to a capacitor 434. Capacitors 432 and 434 are analogous to capacitors 334 and 336 (see FIG. 3). The output side of capacitor 434 and the output side of capacitor 432 are both coupled to an output of operational amplifier 418. Although not shown in FIG. 4, the output sections associated with circuit 400 may be identical to the output sections described above in connection with circuit 300.

The operation of circuit 400 is analogous to the operation of circuit 300. However, the alternate configuration of the active circuit portion of circuit 400, and particularly the switching network configuration, reduces the amount of crosstalk between the channel one signal and the channel two signal. The crosstalk reduction is due to the isolation of certain residual effects associated with the stray capacitances of switches 426, 452, 428, and 430, and the stray capacitances of certain portions of the wiring of circuit 400. As described above, circuit 400 only has two switch terminals coupled to the input of operational amplifier 418, while circuit 300 has four switch terminals coupled to the input of operational amplifier 318. Consequently, when switches 426 and 428 are closed (and switches 452 and 430 are open), switch 430 is the only source of a stray capacitance. A similar isolation effect occurs when the switching states are reversed; capacitor 432, switch 426, and the corresponding wiring therebetween are isolated from capacitor 434. The reduction of parasitic capacitance and residual charges in this manner enables circuit 400 to be employed in applications having relatively rigorous crosstalk requirements.

Circuit 400 may include any number of additional switches configured to increase the isolation between the two channels. For example, appropriately controlled switches may be located near capacitors 434 and 432 to further reduce the effects of residual charges. In addition, the timing and layout of the various switches may be configured in any suitable manner.

As discussed above, a multiple channel signal processing circuit utilizes a shared active circuit component to process a plurality of input channels during a clock period. The use of a shared active component results in a reduction of overall operating power and a reduction in the size of the semiconductor implementation.

The present invention has been described above with reference to a preferred embodiment. However, those skilled in the art will recognize that changes and modifications may be made to the preferred embodiment without departing from the scope of the present invention. For example, the specific circuit implementations shown and described herein may be altered to suit the particular application, and the electrical characteristics of the individual components may vary from system to system. In addition, the manner in which the various switches are controlled and implemented may be in accordance with any number of known techniques. These and other changes or modifications are intended to be included within the scope of the present invention, as expressed in the following claims.

What is claimed is:

1. A multiple channel signal processing circuit comprising:
    a first input for receiving a first input signal for a first channel;
    a second input for receiving a second input signal for a second channel;
    a passive network coupled to said first and second inputs, said passive network configured to obtain a sample of said first input signal and a sample of said second input signal;
    a single shared active electronic component coupled to said passive network, said single shared active electronic component configured to alternately process said sample of said first input signal and said sample of said second input signal;
    a channel switching mechanism coupled to said passive network and said single shared active electronic component, said channel switching mechanism configured to switch between processing states associated with said first channel and said second channel during a sampling period;
    a first output section directly coupled to said single shared active electronic component, said first output section configured to provide a first output signal;
    a second output section directly coupled to said single shared active electronic component, said second output section configured to provide a second output signal;
    wherein said passive network and said single shared active electronic component are responsive to said channel switching mechanism to obtain a current sample of said first input signal during a first time period, to obtain a current sample of said second input signal during a second time period subsequent to said first time period, and to process said current sample of said first input signal during said second time period.

2. The multiple channel signal processing circuit of claim 1 wherein said channel switching mechanism comprises a plurality of switches responsive to a multiphase clock.

3. The multiple channel signal processing circuit of claim 1 wherein said passive network, said single shared active electronic component, and said channel switching mechanism are cooperatively configured to process said current sample of said second input signal during a third time period subsequent to said second time period.

4. A multiple channel signal processing method, said method comprising steps of:
   receiving a first input signal for a first channel at a first input and a second input signal for a second channel at a second input;
   sampling said first input signal with a passive network during a first time period;
   sampling said second input signal with said passive network during a second time period;
   processing a sample of said first input signal with a single shared active electronic component during said second time period;
   processing a sample of said second input signal with said single shared active electronic component during a third time period;
   producing an output sample for said first channel at a first output section directly coupled to said single shared active electronic component in response to said step of processing a sample of said first input signal;
   producing an output sample for said second channel at a second output section directly coupled to said single shared active electronic component in response to said step of processing a sample of said second input signal.

5. The method of claim 4 wherein said step of producing an output sample for said first channel is performed during said third time period and said step of producing an output sample for said second channel is performed during a fourth time period.

6. A multiple channel signal processing circuit comprising:
   a first input for receiving a first input signal for a first channel;
   a second input for receiving a second input signal for a second channel;
   a passive network coupled to said first and second inputs, said passive network configured to obtain a sample of said first input signal and a sample of said second input signal;
   a single shared active electronic component coupled to said passive network, said single shared active electric component configured to alternately process said sample of said first input signal and said sample of said second input signal;
   a channel switching mechanism coupled to said passive network and said single shared active electronic component, said channel switching mechanism configured to switch between processing states associated with said first channel and said second channel during a sampling period;
   a first output section directly coupled to an output of said single shared active electronic component, said first output section comprising a first switch, a second switch, a third switch, and a fourth switch and a first capacitor, wherein an input side of said first switch is coupled to said output of said single shared active electronic component and an output side of said first switch is coupled to said first capacitor, wherein said second switch is coupled between said output side of said first switch and ground, wherein an input side of said third switch is coupled to said first capacitor and an output side of said third switch is coupled to a first channel output, and wherein said fourth switch is coupled between said input side of said third switch and ground;
   a second output section directly coupled to an output of said single shared active electronic component, said second output section comprising a firth switch, a sixth switch, a seventh switch, and an eighth switch and a second capacitor, wherein an input side of said fifth switch is coupled to said output of said single shared active electronic component and an output side of said fifth switch is coupled to said second capacitor, wherein said sixth switch is coupled between said output side of said fifth switch and ground, wherein an input side of said seventh switch is coupled to said second capacitor and an output side of said seventh switch is coupled to a second channel output, and wherein said eighth switch is coupled between said input side of said seventh switch and ground;
   wherein said passive network and said single shared active electronic component are responsive to said channel switching mechanism to obtain a current sample of said first input signal during a first time period, to obtain a current sample of said second input signal during a second time period subsequent to said first time period, and to process said current sample of said first input signal during said second time period.

7. The multiple channel signal processing circuit of claim 6 wherein said channel switching mechanism comprises a plurality of switches responsive to a multiphase clock.

8. The multiple channel signal processing circuit of claim 6 wherein said passive network, said single shared active electronic component, and said channel switching mechanism are cooperatively configured to process said current sample of said second input signal during a third time period subsequent to said second time period.

9. In a multiple channel signal processing circuit comprising an input section for a first input signal associated with a first channel and for a second input signal associated with a second channel, an output section for a first output signal associated with said first channel and for a second output signal associated with said second channel, and a single shared active electronic component directly coupled to said output section and configured to process samples of said first input signal and samples of said second input signal, a signal processing method comprising steps of:
   configuring said input section to obtain a first sample of said first input signal in response to a first control signal;
   reconfiguring said input section to obtain a first sample of said second input signal in response to a second control signal;
   configuring said single shared active electronic component to process said first sample of said first input signal in response to said second control signal;
   reconfiguring said single shared active electronic component to process said first sample of said second input signal in response to a third control signal.

10. The signal processing method of claim 9 further comprising a step of reconfiguring said input section to obtain a second sample of said first input signal in response to said third control signal.

11. The signal processing method of claim 9 further comprising a step of configuring said output section to produce a first output sample associated with said first sample of said first input signal, said configuring said output section step being responsive to said third control signal.

12. The signal processing method of claim 11 further comprising a step of reconfiguring said output section to produce a first output sample associated with said first sample of said second input signal, said reconfiguring said output section step being responsive to a fourth control signal.

13. The signal processing method of claim 9 wherein said configuring said input section step, said reconfiguring said input section step, said configuring said single shared active electronic component step, and said reconfiguring said single shared active electronic component step are performed by a plurality of switches.

14. The signal processing method of claim 9 wherein said first, said second, and said third control signals are associated with a multiphase sampling clock.

\* \* \* \* \*